(12) United States Patent
Moon et al.

(10) Patent No.: US 10,491,019 B2
(45) Date of Patent: Nov. 26, 2019

(54) BATTERY MANAGEMENT SYSTEM AND METHOD OF CONTROLLING THE SAME

(71) Applicant: Hyundai Motor Company, Seoul (KR)

(72) Inventors: Hyo Sik Moon, Hwaseong-si (KR); Jun Ho Bang, Anyang-si (KR); Woo Sung Kim, Suwon-si (KR); Kyung In Min, Seongnam-si (KR); Jae Hoon Choi, Gunpo-si (KR); Jin Wook Kim, Anyang-si (KR); Dong Il Kim, Seongnam-si (KR); Ji Won Nam, Gwangmyeong-si (KR); Yong Hwan Choi, Yongin-si (KR); Yoon Jun Lee, Seoul (KR); Jeong Hun Seo, Suwon-si (KR); Hui Tae Yang, Seoul (KR); Jun Seok Choi, Suwon-si (KR); Yu Seok Kim, Seoul (KR); Jung Je Woo, Goyang-si (KR); Byung Su Kim, Incheon (KR); Yong Jae Kim, Suwon-si (KR); Kyung Ho Kim, Ansan-si (KR); Suk Hyung Kim, Gunpo-si (KR); Hae Kyu Lim, Bucheon-si (KR)

(73) Assignee: Hyundai Motor Company, Seoul (KR)

( * ) Notice: Subject to any disclaimer, the term of this patent is extended or adjusted under 35 U.S.C. 154(b) by 163 days.

(21) Appl. No.: 15/377,163

(22) Filed: Dec. 13, 2016

(65) Prior Publication Data
US 2018/0115178 A1  Apr. 26, 2018

(30) Foreign Application Priority Data
Oct. 26, 2016 (KR) .................. 10-2016-0140045

(51) Int. Cl.
*H02J 7/00* (2006.01)
*H02J 7/14* (2006.01)
(Continued)

(52) U.S. Cl.
CPC ...... *H02J 7/0068* (2013.01); *G01R 19/16542* (2013.01); *G01R 31/3835* (2019.01); *H02J 7/0004* (2013.01)

(58) Field of Classification Search
USPC .................. 320/132, 134, 135, 136, 137
See application file for complete search history.

(56) References Cited

U.S. PATENT DOCUMENTS

| | | | | |
|---|---|---|---|---|
| 5,633,573 A | * | 5/1997 | van Phuoc | G01R 31/3655 320/128 |
| 6,025,695 A | * | 2/2000 | Friel | H01M 10/4257 112/130 |

(Continued)

FOREIGN PATENT DOCUMENTS

| | | |
|---|---|---|
| JP | 2008-309041 A | 12/2008 |
| JP | 2014-187731 A | 10/2014 |

(Continued)

*Primary Examiner* — Alexis B Pacheco
(74) *Attorney, Agent, or Firm* — Morgan, Lewis & Bockius LLP

(57) ABSTRACT

A battery management system (BMS) may include a battery, a relay configured to electrically connect and disconnect the battery for supplying a voltage (an electric power) to an electric load to and from the electric load, the electric load configured to receive the voltage (the electric power) from the battery, to compare the received voltage (the electric power) with a reference value and to output a wakeup signal according to the compared result, when the relay is electrically connected, and a controller configured to wake up by the wakeup signal, to monitor a state of the battery and to control a state of the relay. It is possible to prevent overdischarge and overcharge of the battery by monitoring the battery through the electric load in a state in which a vehicle is turned off and switching the BSM to a wakeup state only if necessary.

6 Claims, 2 Drawing Sheets

(51) Int. Cl.
    *G01R 31/3835*    (2019.01)
    *G01R 19/165*    (2006.01)

(56) References Cited

U.S. PATENT DOCUMENTS

| | | | |
|---|---|---|---|
| 2004/0066174 A1* | 4/2004 | Choi | H02J 7/0054 320/149 |
| 2004/0178766 A1* | 9/2004 | Bucur | H02J 7/0013 320/112 |
| 2005/0184687 A1* | 8/2005 | Hong | F04B 35/045 318/66 |
| 2009/0021610 A1* | 1/2009 | Lee | H04N 5/2251 348/241 |
| 2013/0207455 A1* | 8/2013 | Doljack | H02J 7/0036 307/9.1 |
| 2016/0094056 A1* | 3/2016 | Dulle | H02J 7/007 320/126 |
| 2016/0164328 A1* | 6/2016 | Kim | H02J 7/0052 320/112 |
| 2016/0195864 A1* | 7/2016 | Kim | G05B 15/02 709/221 |
| 2018/0013297 A1* | 1/2018 | Yoon | B60R 16/033 |

FOREIGN PATENT DOCUMENTS

| | | |
|---|---|---|
| KR | 20-1999-0023743 | 7/1999 |
| KR | 10-2006-0073965 | 6/2006 |
| KR | 10-2013-0078028 A | 7/2013 |
| KR | 10-2013-0104149 A | 9/2013 |
| KR | 10-2013-0116419 A | 10/2013 |

* cited by examiner

BATTERY MANAGEMENT SYSTEM AND METHOD OF CONTROLLING THE SAME

CROSS-REFERENCE TO RELATED APPLICATION

The present application claims priority to Korean Patent Application No. 10-2016-0140045, filed on Oct. 26, 2016, the entire contents of which is incorporated herein for all purposes by this reference.

BACKGROUND OF THE INVENTION

Field of the Invention

The present invention relates to a battery management system (BMS) and a method of controlling the same and, more particularly, to a battery management system capable of preventing overdischarge and overcharge of a battery by monitoring the battery through an electric load in a state in which a vehicle is turned off and switching the BSM to a wakeup state only if necessary, and a method of controlling the same.

Description of Related Art

An electric vehicle, which is an eco-friendly vehicle, or a fuel cell vehicle includes a low-voltage battery (also referred to as an auxiliary battery) in order to provide a voltage necessary to start the vehicle and provide a voltage to electric loads operating at a low voltage. In addition, a general internal combustion engine vehicle for driving an engine using fossil fuel includes a battery which is rechargeable in order to start the vehicle or provide the voltage to electric loads.

As such a battery, cheap lead-acid batteries have been used up to now, but will be replaced with lithium batteries having long lifespan and excellent electrical properties in future.

Since the lithium battery should prevent full discharge, when a state of charge of an auxiliary battery becomes less than a predetermined threshold voltage (lower-limit discharge voltage), electrical connection with a vehicle system is interrupted using a relay. Since an auxiliary battery system including such a lithium battery, a relay, etc. needs to be appropriately controlled, a controller such as a battery management system may be used in a vehicle.

Accordingly, a controller for implementing a battery management system should always maintain a controller in a wakeup state to monitor the state of a battery in order to prevent overdischarge and overcharge of an auxiliary battery.

The information disclosed in this Background of the Invention section is only for enhancement of understanding of the general background of the invention and should not be taken as an acknowledgement or any form of suggestion that this information forms the prior art already known to a person skilled in the art.

BRIEF SUMMARY

Various aspects of the present invention are directed to providing a battery management system capable of preventing overdischarge and overcharge of a battery by monitoring the battery through an electric load in a state in which a vehicle is turned off and switching the BSM to a wakeup state only if necessary, and a method of controlling the same.

In accordance with the present invention, the above and other objects can be accomplished by the provision of a battery management system including a battery, a relay configured to electrically connect and disconnect the battery for supplying a voltage to an electric load to and from the electric load, the electric load configured to receive the voltage from the battery, to compare the received voltage with a reference value and to output a wakeup signal according to the compared result, when the relay is electrically connected, and a controller configured to wake up by the wakeup signal, to monitor a state of the battery and to control a state of the relay.

The controller may include a power supply connected to the battery and configured to receive a driving voltage, a wakeup input device configured to receive the wakeup signal from the electric load and to switch to a wakeup state, and a relay controller configured to monitor the state of the battery and control ON/OFF of the relay according to a state of charge (SoC) of the battery, when switching to the wakeup state is performed in the wakeup input device.

The electric load may compare the voltage received from the battery with the reference value and output the wakeup signal when the received voltage is less or greater than the reference value.

The electric load may include a control device for comparing the voltage output from the battery with the reference value and generating the wakeup signal in correspondence with the compared result.

A relay controller may monitor the state of the battery and control OFF of the relay when a state of charge (SoC) of the battery is less than a predetermined level or is greater than a predetermined level.

In accordance with an aspect of the present invention, a method of controlling the battery management system includes applying a voltage from the battery to the electric load in a state of turning a vehicle off and outputting the wakeup signal and waking up by the wakeup signal, monitoring the state of the battery and controlling the state of the relay.

The outputting of the wakeup signal may include comparing the voltage received from the battery with the reference value and generating and outputting the wakeup signal in correspondence with the compared result.

When the voltage received from the battery is less than a reference value or is greater than a reference value, the wakeup signal may be generated.

The controlling of OFF of the relay may include receiving a driving voltage from the battery, receiving the wakeup signal from the electric load and switching to a wakeup state, monitoring the state of the battery upon switching to the wakeup state, and controlling ON/OFF of the relay according to a state of charge (SoC) of the battery.

When a state of charge (SoC) of the battery is less than a predetermined level or is greater than a predetermined level, the relay may be controlled to be turned off.

The methods and apparatuses of the present invention have other features and advantages which will be apparent from or are set forth in more detail in the accompanying drawings, which are incorporated herein, and the following Detailed Description, which together serve to explain certain principles of the present invention.

Figure 1:
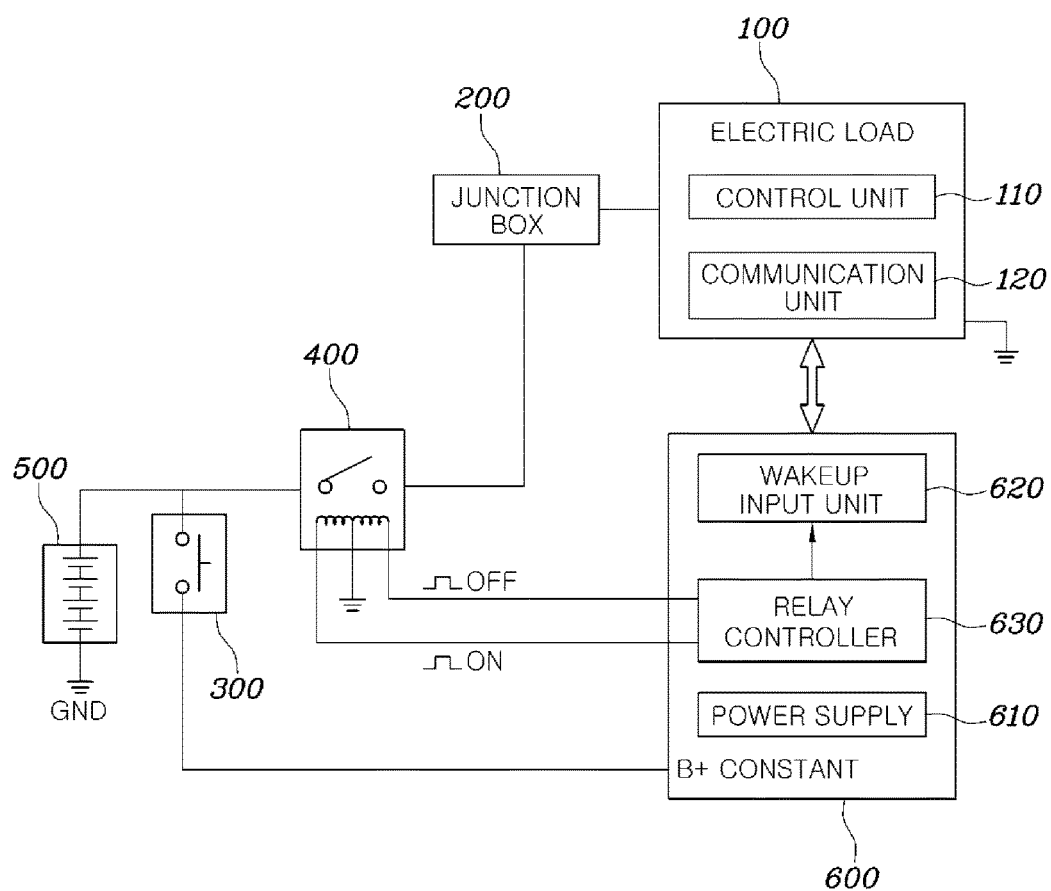
FIG. 1 is a diagram showing the configuration of a battery management system according to an exemplary embodiment of the present invention.

It should be understood that the appended drawings are not necessarily to scale, presenting a somewhat simplified representation of various features illustrative of the basic principles of the invention. The specific design features of the present invention as disclosed herein, including, for example, specific dimensions, orientations, locations, and shapes will be determined in part by the particular intended application and use environment.

In the figures, reference numbers refer to the same or equivalent parts of the present invention throughout the several figures of the drawing.

DETAILED DESCRIPTION

Reference will now be made in detail to various embodiments of the present invention(s), examples of which are illustrated in the accompanying drawings and described below. While the invention(s) will be described in conjunction with exemplary embodiments, it will be understood that the present description is not intended to limit the invention(s) to those exemplary embodiments. On the contrary, the invention(s) is/are intended to cover not only the exemplary embodiments, but also various alternatives, modifications, equivalents and other embodiments, which may be included within the spirit and scope of the invention as defined by the appended claims.

In describing the present invention, a detailed description of known technologies will be omitted when it may obscure the subject matter of the present invention. In addition, ordinals (e.g., first, second, etc.) used in this specification are merely used to distinguish one component from another component.

In this specification, it will be understood that, when one element is referred to as being "connected to" or "coupled to" another element, one element may be "connected to" or "coupled to" another element via a further element although one element may be directly connected to or directly coupled to another element.

Hereinafter, the exemplary embodiment of the present invention will be described in detail with reference to the accompanying drawings.

FIG. 1 is a diagram showing the configuration of a battery management system according to an exemplary embodiment of the present invention. As shown in FIG. 1, the battery management system according to an exemplary embodiment of the present invention includes a battery 500, a relay 400 for electrically connecting and disconnecting the battery 500 for supplying a voltage to and from an electric load 100, the electric load 100 for receiving and comparing the voltage output from the battery 500 with a reference value and outputting a wakeup signal according to the compared result when the relay 400 is electrically connected, and a controller 600 waking up by the wakeup signal to monitor the state of the battery and to control the state of the relay.

In addition, the battery management system of the vehicle according to the embodiment of present invention may further include a junction box 200 for establishing electrical connection between the relay 400 and the loads and a reconnection switch 300 having one end portion connected to the battery 500 and the other end portion electrically connected thereto or disconnected therefrom according to external input.

The battery 500 stores electric energy to output low-voltage power (e.g., about 12 V). The battery 500 may be used to provide power to various types of loads which need to operate upon starting a vehicle and, in some cases, to provide power necessary for a low-voltage load during driving of the vehicle.

In several embodiments of the present invention, the battery 500 may be a low-voltage battery or an auxiliary battery to be distinguished from a high-voltage battery for driving a motor when applied to an eco-friendly vehicle for driving a motor with high-voltage power and may be simply referred to as a battery in a general internal combustion engine vehicle.

A lead-acid battery or a lithium battery is applicable as the battery 500. Cheap lead-acid batteries have been mainly applied up to now, but tend to be replaced with lithium batteries having long lifespan and high reliability. Since performance of the lithium battery is rapidly deteriorated upon being discharged to a predetermined voltage or less, a relay 20 for disconnecting the battery from a vehicle system when a voltage is reduced to the predetermined voltage or less is required. Although a lithium battery needs to be used as the battery 500 of the vehicle in the several embodiments of the present invention, the battery 500 is not limited to the lithium battery and a lead-acid battery may be used as the battery 500.

The relay 400 electrically connects or disconnects the battery 500 (in particular, the lithium battery) to or from the vehicle system. The relay 400 has a front end portion electrically connected to the battery 500 and a rear end portion connected to the vehicle system. The electrical connection state between the battery 400 and the vehicle system may be determined through operation for electrically connecting and disconnecting the front end portion and the rear end portion.

The ON/OFF state of the relay 400 may be determined by an external control signal. For example, when a control signal having a specific voltage is applied to one end portion of a coil included in the relay 400 to turn the relay on, the front and rear end portions of the relay 400 are electrically connected. When a control signal having a specific voltage is applied to the other end portion of the coil included in the relay 400 to turn the relay off, the front and rear end portions of the relay 400 may be electrically disconnected. To this end, the relay 400 may have two control signal input terminals for receiving the control signal for ON and the control signal for OFF.

For example, when the battery 500 operates under a normal condition (e.g., the voltage of the battery 500 is between predetermined upper-limit and lower-limit voltages), the relay 400 may be controlled to be maintained in a connection state, that is, in an ON state. In contrast, when the voltage of the battery 500 is less than a predetermined threshold (lower-limit) voltage, the relay 400 may be controlled to a disconnection state, that is, an OFF state. The control signals for determining the ON/OFF state of the relay are provided by the controller 600.

The junction box 200 electrically connects elements related to low-voltage operation of the vehicle power system to each other. A plurality of connection terminals included in the junction box 200 is electrically connected to each other. Accordingly, a plurality of devices connected to the junction box 200 may be electrically connected to each other.

The reconnection switch 300 receives an external signal to reconnect the relay 400 in a state in which the relay 400 is turned off. The reconnection switch 300 may have both end portions electrically connected to or disconnected from each other according to external input. One end portion of the reconnection switch 300 may be connected to the battery 500 and the other end portion thereof may be connected to the controller 600. In several embodiments of the present invention, when the reconnection switch 300 is turned on by external input, the controller 600 connected to the other end portion of the reconnection switch 300 may provide the control signal for turning the relay 400 on to the relay 400.

The electric load 100 may include a control device 110 for comparing the voltage output from the battery 500 with a reference value and generating a wakeup signal in correspondence with the compared result and a communication device 120 for transmitting the wakeup signal to the controller. The electric load 100 may include a lamp, a heater, an air conditioner, a windshield wiper, an ABS, an EPS, etc., all of which operate with the voltage received from the battery 500 upon turning the vehicle off. Since such an electric load 100 is driven by the voltage received from the battery 500 through the junction box 200, the state of the battery may be monitored. The other examples of the electric load 100 include a smart key module and a telematics system. Since the telematics system may be connected to a mobile terminal through an application mounted in the mobile terminal of a driver, the connection state of the battery may be actively managed through the mobile terminal (e.g., the ON/OFF state of the relay 400 is controlled through the BMS) and the electrical state of the battery may be monitored.

The electric load 100 compares the voltage received from the battery 500 with the reference value and outputs the wakeup signal when the received voltage is greater or less than the reference value. That is, when the voltage of the battery is greater than the reference value, it is determined that the battery is in the overcharge state, outputting the wakeup signal, and, when the voltage of the battery is less than the reference value, it is determined that the battery is in the overdischarge state, outputting the wakeup signal.

The controller 600 may receive a first constant voltage from a connection line between the battery 500 and the relay 400 and receive a second constant voltage from a connection line between the relay 400 and the load.

The first constant voltage is shown as a voltage supplied from the connection line between the battery 500 and the relay 400 to the power supply 610 of the controller 600 and the second constant voltage is shown in as a voltage supplied from the junction box 200 connected to the rear end portion of the relay 400 to the power supply 610 of the controller 600.

In several embodiments of the present invention, the controller 600 may be implemented as a battery management system (BMS) applied to a vehicle. Since a high-voltage battery and a low-voltage battery (auxiliary battery) tend to be combined in an eco-friendly vehicle, the controller 600 may be implemented by one battery management system controller for simultaneously managing the high-voltage battery and the low-voltage battery. In the specification and the drawings, the term controller is replaced with the acronym BMS.

The controller 600 may include the power supply 610, a wakeup input device 620 and a relay controller 630.

The power supply 610 is directly connected to the battery 500 to receive the first constant voltage from the connection line between the battery 500 and the relay 400 and to receive the second constant voltage from the connection line between the relay 400 and the load. The power supply 610 may stop operation in a sleep state and supply a voltage to all the components of the controller 600 when the wakeup input device 620 receives a specific signal indicating wakeup. In one exemplary embodiment of the present invention, since the constant voltage is directly received from the battery 500, wakeup is possible even in a state in which the relay 400 is turned off.

The wakeup input device 620 receives a signal for waking the controller 600 up. When the wakeup input device 620 receives a wakeup signal, the controller 600 supplies a voltage to the components thereof to start normal operation. That is, the controller 600 is switched to the sleep state capable of performing minimum operation in a state of turning the vehicle off. In the sleep state, the controller 600 cannot perform normal control operation. For example, the controller 600 cannot turn the relay 400 on/off in the sleep state. When the wakeup input device 620 receives the wakeup signal, the controller 600 supplies the constant voltage to the components thereof to start operation.

The wakeup input device 620 receives the wakeup signal from the electric load. That is, upon determining that the state of the battery is in the overcharge or the overdischarge state as the result of detecting the voltage of the battery, the electric load 100 outputs the wakeup signal and the wakeup input device receives the wakeup signal.

In addition, the wakeup signal may be key input of the vehicle, input from the reconnection switch 300 or over-voltage input of the rear end portion of the relay 400. For example, when the wakeup input device 620 receives a signal for turning an accessory ACC or ignition IG1 on from a startup key of the vehicle, the wakeup input device 620 may wake the controller 600. In addition, when the reconnection switch 300 is connected to apply a voltage to the wakeup input device 620, the wakeup input device 620 may wake the controller 600.

The relay controller 630 supplies a control signal for controlling an electrical connection state of the relay 400 to the relay 400. As described above, for example, when the battery voltage detected by a voltage sensor provided in the battery 500 becomes less than a predetermined threshold, the relay controller 630 may supply, to the relay 400, a control signal for turning the relay 400 off. That is, when switching to the wakeup state is performed by the wakeup input device 620, the relay controller 630 monitors the state of the battery and controls ON/OFF of the relay according to the state of charge (SoC) of the battery. At this time, when the SoC of the battery is less than or greater than a predetermined level, the relay is turned off to control overdischarge or overcharge of the battery.

In addition, when the reconnection switch 300 is turned on and thus the voltage of the battery is input to the controller 600, the relay controller 630 may supply, to the relay 400, a control signal for turning the relay 400 on.

The relay controller 630 provides a pulse-shaped signal as a control signal for controlling the relay 400. That is, the relay controller 630 controls ON/OFF of the relay using the pulse-shaped signal. Therefore, it is possible to prevent the coil included in the reconnection switch 300 from being damaged even when the reconnection switch 300 is turned on for a long time period.

The battery management system of the present invention having the above-described configuration is characterized in that a plurality of voltages for operation of the controller 600 is provided. That is, as described with reference to FIG. 1, the controller 600 receives the first constant voltage from the connection line between the battery 500 and the relay 400 and receives the second constant voltage from the connection line between the relay 400 and the load. The first constant voltage and the second constant voltage are received from the power supply 610 of the controller 600.

Figure 2:
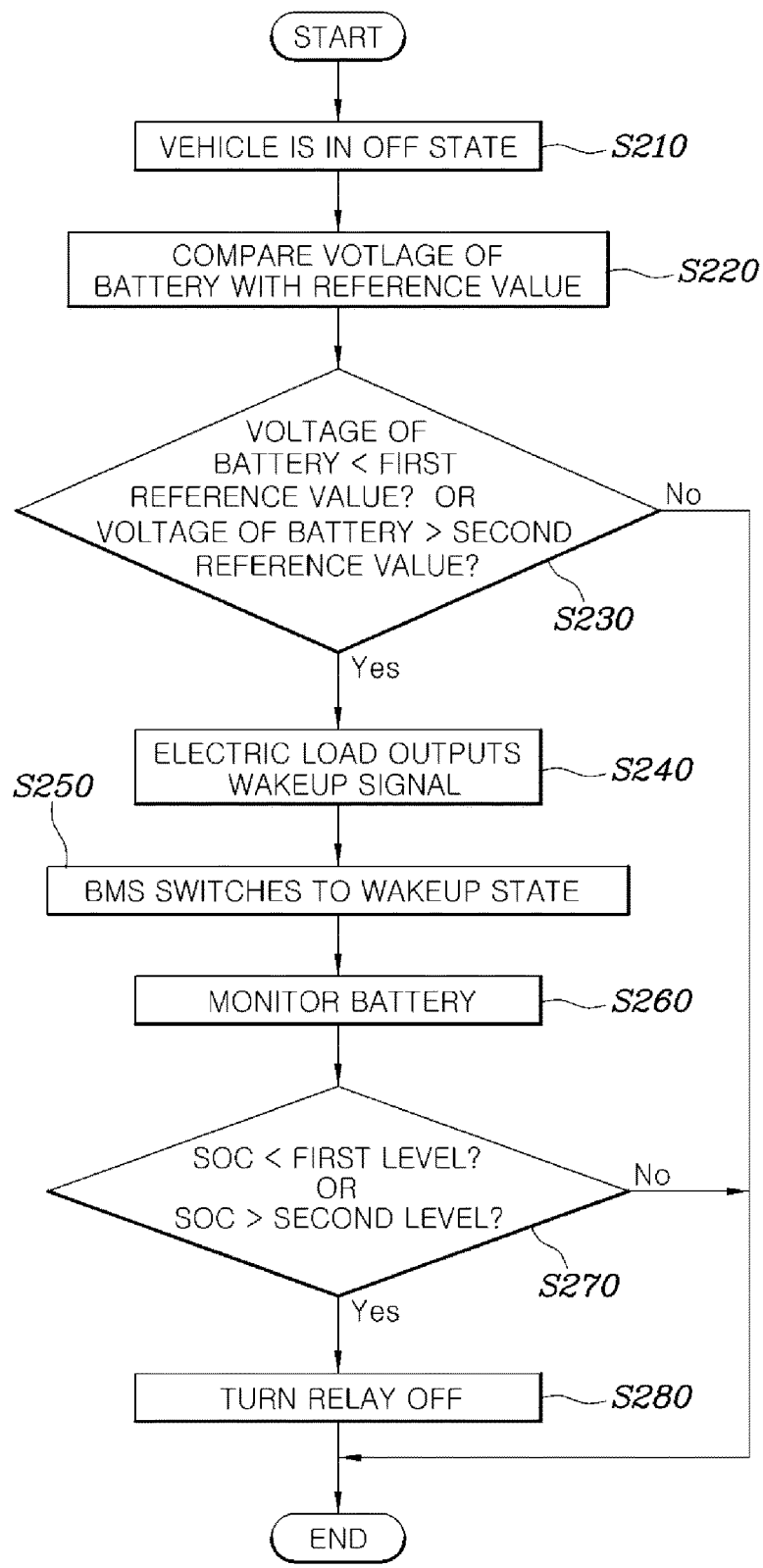
FIG. 2 is a flowchart illustrating a method of controlling a battery management system according to an exemplary embodiment of the present invention.

FIG. 2 is a flowchart illustrating a method of controlling a battery management system according to an exemplary embodiment of the present invention. As shown in FIG. 2, the method of controlling the battery management system according to the exemplary embodiment of the present invention performs a step of applying a voltage from the battery to the electric load in a state of turning the vehicle off (S210) and comparing the voltage received from the battery with a predetermined reference value (S220). Here, the controller 600 is switched to the sleep state capable of performing minimum operation in a state of turning the vehicle off. In the sleep state, the controller 600 cannot perform normal control operation. For example, the controller 600 cannot turn the relay 400 on/off in the sleep state.

Accordingly, in the sleep state of the controller 600, the electric load compares the voltage received from the battery with the predetermined reference value.

Subsequently, the electric load 100 compares the voltage received from the battery 500 with the reference value (S230) and outputs the wakeup signal when the voltage received from the battery is less than or greater than the reference value (S240). Here, the reference value may include a first reference value for determining the overdischarge state of the battery 500 and a second reference value for determining the overcharge state of the battery 500. That is, when the voltage of the battery is less than the first reference value, it is determined that the battery is in the overdischarge state, generating and outputting the wakeup signal, and, when the voltage of the battery is greater than the second reference voltage, it is determined that the battery is in the overcharge state, generating and outputting the wakeup signal.

Subsequently, when the wakeup input device 620 receives the wakeup signal from the electric load 400 (S250), the controller 600 supplies the constant voltage to the components thereof to start operation. The controller is switched to the wakeup state to monitor the state of the battery (S260).

Next, the state of the battery is monitored and the state of charge (SoC) of the battery is compared with the predetermined reference level to determine whether the battery is in the overcharge state or the overdischarge state (S270). The reference level may include a first reference level for determining the overdischarge state of the battery and a second reference level for determining the overcharge state of the battery. That is, when the SoC of the battery is less than the first reference level, it may be determined that the battery is in the overdischarge state and, when the SoC of the battery is greater than the second reference level, it may be determined that the battery is in the overcharge state.

Here, various conventional technologies may be used to determine the SoC of the battery 500. For example, a method of determining the SoC of the battery using the output voltage of the battery 500 may be used as a simplest method. In step S270, when the voltage of the battery 500 is less than the reference voltage value corresponding to the first reference level as the result of comparing the voltage of the battery 500 with the reference voltage value corresponding to the first reference level, it may be determined that the battery is in the overdischarge state and, when the voltage of the battery 500 is greater than the reference voltage value corresponding to the second reference level as the result of comparing the voltage of the battery 500 with the reference voltage value corresponding to the second reference level, it may be determined that the battery is in the overcharge state.

Subsequently, the relay is turned on/off according to the SoC of the battery (S280). That is, the relay controller 630 supplies, to the relay 400, the control signal for controlling the electrical connection state of the relay 400. As described above, for example, when the battery voltage detected by a voltage sensor provided in the battery 500 becomes less than the predetermined threshold, the relay controller 630 may supply, to the relay 400, the control signal for turning the relay 400 off. That is, when switching to the wakeup state is performed by the wakeup input device 620, the relay controller 630 monitors the state of the battery and controls ON/OFF of the relay according to the battery charging state. At this time, when the SoC of the battery is less than a predetermined level or is greater than a predetermined level, the relay is turned off to control overdischarge or overcharge of the battery.

Accordingly, the controller may not always monitor the wakeup state but may receive the wakeup signal from the electric load and control the relay upon determining that the battery is in the overcharge or the overdischarge state.

According to an exemplary embodiment of the present invention, it is possible to prevent overdischarge and overcharge of a battery by monitoring the battery through an electric load in a state in which a vehicle is turned off and switching the BSM to a wakeup state only if necessary.

The foregoing descriptions of specific exemplary embodiments of the present invention have been presented for purposes of illustration and description. They are not intended to be exhaustive or to limit the invention to the precise forms disclosed, and obviously many modifications and variations are possible in light of the above teachings. The exemplary embodiments were chosen and described in order to explain certain principles of the invention and their practical application, to thereby enable others skilled in the art to make and utilize various exemplary embodiments of the present invention, as well as various alternatives and modifications thereof. It is intended that the scope of the invention be defined by the Claims appended hereto and their equivalents.

What is claimed is:

1. A battery management system comprising:
   a battery;
   a relay configured to electrically connect or disconnect the battery for supplying a voltage to an electric load to or from the electric load;
   the electric load configured to receive the voltage from the battery, to be operated with the voltage from the battery, to compare the received voltage with a first reference value for determining an overdischarge state of the battery or a second reference value for determining an overcharge state of the battery, and to output a wakeup signal when the voltage of the battery is less than the first reference value or greater than the second reference voltage; and
   a controller configured to wake up by the wakeup signal, to monitor a state of the battery and to control a state of the relay based on the monitored state of the battery.

2. The battery management system according to claim 1, wherein the controller includes:
   a power supply connected to the battery and configured to receive a driving voltage;
   a wakeup input device configured to receive the wakeup signal from the electric load and to switch to a wakeup state; and
   a relay controller configured to monitor the state of the battery and control ON/OFF of the relay according to a state of charge (SoC) of the battery, when switching to the wakeup state is performed in the wakeup input device.

3. The battery management system according to claim 1, wherein a relay controller is configured to monitor the state of the battery and controls OFF of the relay when a state of charge (SoC) of the battery is less than a first predetermined level or is greater than a second predetermined level.

4. A method of controlling the battery management system according to claim 1, the method comprising:
   applying a voltage from the battery to the electric load in a state of turning a vehicle off and outputting the wakeup signal; and
   waking up by the wakeup signal, monitoring the state of the battery and controlling the state of the relay.

5. The method according to claim 4, wherein the controlling of OFF of the relay includes:
   receiving a driving voltage from the battery, receiving the wakeup signal from the electric load and switching to a wakeup state;
   monitoring the state of the battery upon switching to the wakeup state; and
   controlling ON/OFF of the relay according to a state of charge (SoC) of the battery.

6. The method according to claim 5, wherein, when the state of charge (SoC) of the battery is less than a first predetermined level or is greater than a second predetermined level, the relay is configured to be controlled to be turned off.

\* \* \* \* \*